United States Patent
Blednov

(10) Patent No.: US 8,253,494 B2
(45) Date of Patent: Aug. 28, 2012

(54) DOHERTY AMPLIFIER WITH COMPOSED TRANSFER CHARACTERISTIC HAVING MULTIPLE PEAK AMPLIFIERS

(75) Inventor: Igor Blednov, Nijmegen (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 12/967,084

(22) Filed: Dec. 14, 2010

(65) Prior Publication Data

US 2011/0140783 A1  Jun. 16, 2011

(30) Foreign Application Priority Data

Dec. 15, 2009  (EP) .................................... 09179345

(51) Int. Cl.
*H03F 3/68* (2006.01)
(52) U.S. Cl. .................... 330/295; 330/124 R; 330/302
(58) Field of Classification Search .................. 330/295, 330/124 R, 302
See application file for complete search history.

(56) References Cited

U.S. PATENT DOCUMENTS

| | | | | |
|---|---|---|---|---|
| 5,786,727 | A * | 7/1998 | Sigmon ........................ | 330/124 R |
| 6,262,629 | B1 * | 7/2001 | Stengel et al. ............. | 330/124 R |
| 6,940,349 | B2 * | 9/2005 | Hellberg .................... | 330/124 R |
| 7,064,606 | B2 * | 6/2006 | Louis ......................... | 330/124 R |
| 7,498,878 | B2 * | 3/2009 | Lim ........................... | 330/124 R |
| 7,756,494 | B2 * | 7/2010 | Fujioka et al. ............. | 455/127.1 |
| 2005/0231286 | A1 | 10/2005 | Gotou et al. | |
| 2008/0284509 | A1 | 11/2008 | Kim et al. | |
| 2010/0117726 | A1 * | 5/2010 | Okubo et al. .............. | 330/124 R |
| 2010/0315162 | A1 * | 12/2010 | Gajadharsing et al. ... | 330/124 R |

FOREIGN PATENT DOCUMENTS

WO  2009/031042 A2  3/2009

OTHER PUBLICATIONS

Raab, F. "Efficiency of Doherty RF Power Amplfier Systems", IEEE Trans. On Broadcasting, vol. BC-33, No. 3, pp. 77-83 (Sep. 1987).
van der Heijden, M. et al. "Theory and Design of an Ultra-Linear Square-law Approximated LDMOS Power Amplifier in Class-AB Operation", IEEE Trans. On Microwave Theory and Techniques, vol. 50, No. 9, pp. 2176-84 (Sep. 2002).
Eccleston, K. "Analysis of a Multi-Transistor Interleaved Doherty Amplifier", IEEE Microwave Conf., pp. 1581-84 (2009).
Extended European Search Report for European Patent Appln. No. 09179345 (Apr. 2010).

* cited by examiner

*Primary Examiner* — Patricia Nguyen

(57) ABSTRACT

A combination amplifier (1,1a) is provided which comprises a carrier amplifier (7,7a) and a series connection of a first peak amplifier (9,9a) and a second peak amplifier (11,11a) which are provided with a phase-shifted input signal relative to the input signal supplied to the carrier amplifier, wherein a transfer characteristics of the combination amplifier may be optimized by independently adjusting transfer characteristics of the carrier amplifier, the first peak amplifier and the second peak amplifier. Thereby, a linearity and/or an efficiency of the combination amplifier may be improved compared to a conventional Doherty amplifier.

16 Claims, 6 Drawing Sheets

DOHERTY AMPLIFIER WITH COMPOSED TRANSFER CHARACTERISTIC HAVING MULTIPLE PEAK AMPLIFIERS

CROSS-REFERENCE TO RELATED APPLICATIONS

This application claims the priority under 35 U.S.C. §119 of European patent application no. 09179345.5, filed on Dec. 15, 2009, the contents of which are incorporated by reference herein.

FIELD OF THE INVENTION

The present invention relates to a combination amplifier comprising a carrier amplifier, a first peak amplifier, and a second or more peak amplifiers. In particular, the present invention relates to a Doherty amplifier comprising a carrier amplifier, a first peak amplifier, and a second peak amplifier, wherein the Doherty amplifier exhibits improved linearity compared to conventional Doherty amplifiers.

BACKGROUND OF THE INVENTION

A Doherty amplifier may be used as a power amplifier for amplification of RF-signals for transmission via a transmitter. For accurate and cost-effective transmission of the RF-signals it is desirable that the Doherty amplifier has a high efficiency (useful output power divided by totally consumed power), high linearity (degree of proportionality of output signal to input signal) and low distortions, such as low third order intermodulation (IM3).

The publication "Efficiency of Doherty RF power amplifier systems" by Frederik H. Raab, IEEE Transaction on Broadcasting, Volume BC-33, no. 3, September 1987, discloses a Doherty system, wherein at low output levels the first power amplifier operates as a linear class-B amplifier and the drive to the second power amplifier is cut off.

However, it has been observed that a conventional Doherty amplifier may not have sufficient linearity and sufficient efficiency.

There may be a need for an amplifier, in particular for a power amplifier for amplifying RF-signals, which may exhibit an improved linearity and which may also exhibit an improved efficiency compared to conventional amplifiers.

OBJECT AND SUMMARY OF THE INVENTION

According to an aspect a combination amplifier is provided which comprises a combination amplifier input terminal; a combination amplifier output terminal; a carrier amplifier having a carrier amplifier input terminal and a carrier amplifier output terminal; a first peak amplifier having a first peak amplifier input terminal and a first peak amplifier output terminal; a second peak amplifier having a second peak amplifier input terminal and a second peak amplifier output terminal; an input impedance inverter; and an output impedance inverter; wherein one end of the input impedance inverter is connected to the carrier amplifier input terminal and is also connected to the combination amplifier input terminal, and another end of the input impedance inverter is connected to an input mid point to which the first peak amplifier input terminal and the second peak amplifier input terminal are connected; wherein one end of the output impedance inverter is connected to the carrier amplifier output terminal, and another end of the output impedance inverter is connected to an output mid point to which the first peak amplifier output terminal and the second peak amplifier output terminal are connected and the another end is also connected to the combination amplifier output terminal.

Thereby, the combination amplifier may be adapted to amplify an input signal supplied to the combination amplifier input terminal to generate an output signal supplied to the combination amplifier output terminal. In an exemplary embodiment the input signal may be supplied as an input voltage to the combination amplifier and the output signal generated by the combination amplifier may be provided as an output current. In this case an input impedance of the combination amplifier may be very high, whereas an output impedance of the combination amplifier may be relatively low.

The carrier amplifier may be adapted to amplify a carrier amplifier input signal supplied to the carrier amplifier input terminal to generate a carrier amplifier output signal provided at the carrier amplifier output terminal. According to an embodiment the first peak amplifier may be adapted to amplify a first peak amplifier input signal supplied to the first peak amplifier input terminal to generate a first peak amplifier output signal provided at the first peak amplifier output terminal. According to an embodiment the second peak amplifier may be adapted to amplify a second peak amplifier input signal supplied to the second peak amplifier input terminal to generate a second peak amplifier output signal provided at the second peak amplifier output terminal.

The carrier amplifier input signal, the first peak amplifier input signal, and the second peak amplifier input signal may be a voltage signal or a current signal. Further, the carrier amplifier output signal, the first peak amplifier output signal, and the second peak amplifier output signal may be a voltage signal or a current signal. Thus input and output impedances of the carrier amplifier, the first peak amplifier, and the second peak amplifier may vary according to the application.

The input impedance inverter and/or the output impedance inverter may be adapted to provide impedance inversion. Further, the inverters may be or comprise a quarter wave transmission line. Thereby, the inverters may provide a phase-shift to a signal supplied to one end of the impedance inverters.

An effective length of the input impedance inverter and/or the output impedance inverter may at least approximately amount to a quarter of a wavelength of a combination amplifier input signal supplied to the combination amplifier input terminal. Thereby, the combination amplifier input signal may have a frequency up to several GHz. From the frequency of the combination amplifier input signal the wavelength may be calculated taking into account the dielectric constant of the medium the signal is travelling through. Thereby, the input impedance inverter and the output impedance inverter may provide particular materials through which the signal travels. According to an embodiment the input impedance inverter and/or the output impedance inverter may be or may comprise a quarter wave transmission line coupler or an impedance inverting network, such as an L or T network allowing certain required characteristic impedance and phase shift of 90 degrees.

The carrier amplifier, the first peak amplifier, and the second peak amplifier may have different transfer functions that describe a functional relationship between an input signal supplied to their respective input terminals and an output signal supplied to their respective output terminals. In particular, in case of an amplifier device operating as voltage controlled current source, such as FET, the input signals may be input voltage signals and the output signals may be output current signals. In particular, the respective transfer function may describe the respective output current signal as a power expansion of the respective input voltage signal. Thereby, beside other factors, a linearity of the carrier amplifier, the first peak amplifier, and the second peak amplifier may be dependent on the respective transfer function. Further, according to an embodiment a transfer function allowing highly linear operation of the combination amplifier may be derived as a composition of transfer functions of the carrier amplifier, the first peak amplifier, and the second peak amplifier.

The carrier amplifier may operate in a different class than both the first peak amplifier and the second peak amplifier. In particular, the amplifiers may be set to different operation classes by applying different bias voltages to transistor gates comprised in the amplifiers. In particular, the carrier amplifier may operate in class A, class AB, or class B, whereas the first peak amplifier and/or the second peak amplifier may operate in class C. Further, the carrier amplifier may have, in particular due to its different operation class, a higher linearity than both the first peak amplifier and the second peak amplifier. Further, the carrier amplifier may have a lower efficiency than both the first peak amplifier and the second peak amplifier.

An input signal applied at the combination amplifier input terminal may be supplied to the carrier amplifier input terminal without phase-shift, whereas the input signal supplied to the combination amplifier input terminal may be provided to both the first peak amplifier input terminal and the second peak amplifier input terminal having a phase-shift, in particular having a phase-shift of 90°.

According to an embodiment a Doherty amplifier may have a carrier amplifier and a first peak amplifier and a second peak amplifier being connected in parallel. Thereby, a linearity and/or an efficiency of the Doherty amplifier may be improved compared to a conventional Doherty amplifier. Further, there may be more flexibility in configuring the properties of the combination amplifier having the opportunity for independent adjustments regarding their respective transfer functions at the first peak amplifier and the second peak amplifier. Further, providing two independent peak amplifiers allows independent control of parameters (bias voltage, gate width of transistors comprised in the amplifiers, etc.) of the independent peak amplifiers providing more flexibility in the design of the combination amplifier.

According to an embodiment, a first bias voltage is applied to the first peak amplifier input terminal and a second bias voltage is applied to the second peak amplifier input terminal, wherein the second bias input voltage is different from, in particular greater than, the first bias input voltage. Setting different bias voltages to the first peak amplifier and the second peak amplifier may allow adjustment of a first transition point of an input signal above which the first peak amplifier conducts and may allow adjustment of a second transition point of the input signal above which the second peak amplifier conducts. Thereby, a composed transfer function of the combination amplifier may appropriately be defined. Thereby, a linearity and/or an efficiency of the combination amplifier may be improved.

According to an embodiment, the combination amplifier is integrated on a common semiconductor substrate or any other substrate. The substrate may comprise a semiconductor die, such as a silicon die. The substrate may be doped with different elements for providing electron donors and/or acceptors. Thereby, a size of the combination amplifier may be reduced. Further, power consumption may be reduced. Further, integration of the combination amplifier into a handheld device, such as a cellular phone, may be enabled.

According to an embodiment at least one of the input impedance inverter or output impedance inverter comprises of any interconnection or transmission line/microstrip, coplanar or any other or a bond wire, or a combination of both of them. The bond wire may be made of a high conductivity material, like a metal, such as copper, silver or the like. The bond wire may have a length (physical or electrical) that is allowing in combination with parasitic output capacitances of active devices or capacitances located on substrate or both to provide required values for characteristic impedance and phase shift at predetermined frequency. Thereby, a very compact cost-effective input impedance inverter and/or output impedance inverter may be provided.

According to an embodiment a lateral dimension of the substrate including active dies is equal or smaller than a ⅛ of wavelength in given substrate of a signal applied to the combination amplifier input terminal. Herein, a wavelength of the signal may be derived based on a frequency of the signal taking into account dielectric properties of a medium or media of components of the combination amplifier the signal travels through. In particular, the X and Y dimension of the active area of carrier or peak amplifiers should be at least about 12 times smaller than the electrical wavelength of the signal applied and travelling through the active device structures, like fingers and power distributing/power combining metal strips at input and output terminals. In particular, the lateral dimension may be smaller than 10 cm, 2 cm, 1 cm, 0.1 cm, depending on frequency and electrical properties of the used semiconductor substrate or other substrate.

According to a first embodiment the first peak amplifier output terminal and the second peak amplifier output terminal are connected by or to a common metal bar. Thereby, a further size reduction and simplification involving cost reduction of the combination amplifier may be achieved. In particular, the common metal bar may be arranged at the common substrate.

According to a second embodiment the first peak amplifier is located at the one side of the carrier amplifier/device, while second peak amplifier is located at the other side of the carrier amplifier/device, wherein their output terminals are combined at another die connected by a common metal bar or package output terminal/lead.

According to an embodiment each the carrier amplifier, the first peak amplifier, and the second peak amplifier comprise at least one transistor of a group consisting of a FET, and/or JFET, and/or MOSFET, and/or LDMOS, and/or GaN HEMT, and/or a bipolar junction transistor and/or HBT. Thereby, a very cost effective, compact and simple combination amplifier may be provided. According to an embodiment the Doherty amplifier may consist of the same or several different technology type devices/transistors. At least one transistor of the carrier amplifier, the first peak amplifier and the second peak amplifier are mutually of a different type of transistor. According to another embodiment the at least one transistor of the first peak amplifier and the second peak amplifier may be of a same type being different from a type of the at least one transistor of the carrier amplifier. Further, all three transistors may be of a same type of transistor, in particular a FET.

According to an embodiment the at least one transistor of the first peak amplifier and the at least one transistor of the second peak amplifier are of a same type, such as a FET. Thereby, a simplification of the combination amplifier may be achieved. Further, as the first peak amplifier and the second peak amplifier may operate in class C, but biased differently and in such a way having different transfer characteristic, using a same type of the at least one transistor of the first peak amplifier and the second peak amplifier may simplify the structure of the combination amplifier without hampering its performance.

According to an embodiment a gate width of the at least one transistor of the first peak amplifier is different from a gate width of the at least one transistor of the second peak amplifier. Thereby, different amplification characteristics, in particular regarding a respective transfer function, may be provided for the first peak amplifier and the second peak amplifier. The gate width of a given transistor may be a geometrical width of the gate conductor electrode of the transistor. A transfer function, in particular a transconductance, of the peak amplifiers may depend on a combination of several parameters like: bias and threshold voltage of the gate, channel length, doping level, gate oxide thickness and etc, and also width of a transistor comprised in the peak amplifier. Thereby, different transfer characteristics of the first peak amplifier and the second peak amplifier may be achieved for appropriately adjusting a composed transfer function for the entire combination amplifier. Thereby, a transfer characteristics of the combination amplifier may be improved.

According to an embodiment the at least one transistor of the first peak amplifier and the at least one transistor of the second peak amplifier have different threshold voltages above which their gates conduct. Thereby, the first transition point and the second transition point may be adjusted, to control a transfer function of the combination amplifier. According to another embodiment the first peak amplifier may have at least approximately a same threshold voltage as the second peak amplifier.

According to an embodiment the at least one transistor of the first peak amplifier is adapted to have a first transconductance and the at least one transistor of the second peak amplifier is adapted to have a second transconductance, wherein the second transconductance is greater than the first transconductance. The transfer characteristic of an amplifier may be a ratio of a current signal at an output terminal and a voltage signal at an input terminal of that amplifier. In particular, for a FET, the transconductance may be a derivative of the output current signal at the output terminal depending on the input voltage signal applied at the input terminal of the FET (obtained by differentiating the output current with respect to input voltage taken at a particular input voltage). Further, the transconductance may be a coefficient of the linear input voltage term in the transfer function describing the output current signal as a power series of the input voltage. The transconductance may be measured in the international unit Siemens (1 S=1 A/V).

Providing different transconductances and its shape of the first peak amplifier and the second peak amplifier may allow advantageous adaptation of the composed transfer function of the combination amplifier in order to improve its linearity and/or efficiency.

According to an embodiment the at least one transistor of the carrier amplifier is adapted to have a different, in particular smaller, transconductance than the first or the second peak amplifier. Thereby, further adjustment of the composed transfer function of the combination amplifier is enabled allowing further improvements regarding linearity and/or efficiency.

According to an embodiment the carrier transconductance, the first transconductance, the second transconductance, the first bias voltage, and the second bias voltage are such that an output current supplied to the combination amplifier output terminal depends at least approximately on a square of an input voltage applied to the combination amplifier input terminal. Thereby, the output current does not need to exactly depend on a square of the input voltage, but the output current may deviate from the square of the input voltage, wherein the deviation may amount up to some level which may be appropriate to the given application linearity requirement. In particular, the square dependence may be approximated by plural straight lines having different gradients and intersection points.

According to an embodiment the first peak amplifier and the second peak amplifier input terminals, in particular each having LC compensation network of certain values connected between gate and source, are connected to the input mid point via capacitors of certain values. Thereby, advantageous unequal input power division to the two peak amplifier is enabled allowing further improvement of the performance of the combination amplifier.

According to an embodiment at least one of the input mid point, the output mid point, and the carrier input terminal are connected to a LC compensation network. In particular, the LC compensation network may comprise a series connection of an inductance and a capacitor, which are in particular connected to a ground potential. Thereby, advantageous division of an input signal, and/or an output signal may be achieved.

It has to be noted that embodiments of the invention have been described with reference to different subject matters. In particular, some embodiments have been described with reference to methods, whereas other embodiments have been described with reference to apparatus type claims. However, a person skilled in the art will gather from the above and the following description that, unless otherwise notified, in addition to any combination of features belonging to one type of subject matter also any combination between features relating to different subject matters, in particular between features of the method type claims, and features of the apparatus type claims, is considered as to be disclosed with this document. The aspects defined above and further aspects of the present invention are apparent from the examples of embodiment to be described hereinafter and are explained with reference to the examples of embodiment. The invention will be described in more detail hereinafter with reference to examples of embodiment, but to which the invention is not limited.

BRIEF DESCRIPTION OF THE DRAWINGS

Embodiments of the present invention are now described with reference to the accompanying drawing. However, the invention is not restricted to the described or illustrated embodiments.

DESCRIPTION OF EMBODIMENTS

Figure 1B:
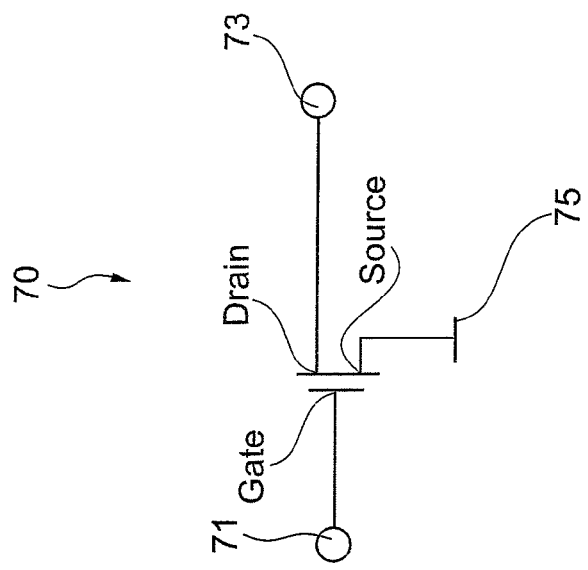
FIGS. 1a and 1b schematically show equivalent circuits of a transistor according to an embodiment.
Figure 1A:
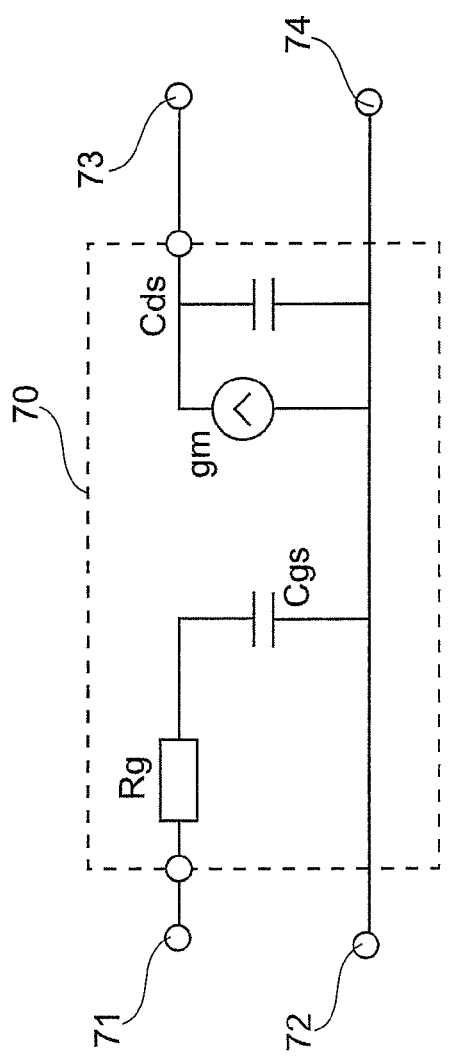

FIG. 1a illustrates an equivalent circuit of a transistor 70 which may be used in a combination amplifier according to an embodiment. The transistor 70 comprises a first input terminal 71 and a second input terminal 72. Further, the transistor 70 comprises a first output terminal 73 and a second output terminal 74. The second input terminal 72 is connected to the second output terminal 74 by a conductor without having any other electronic components connected between the two terminals. The first input terminal 71 is connected via a resistor Rg and an input capacitance Cgs to the conductor connecting the second input terminal 72 to the second output terminal 74. The input capacitance Cgs is connected to a transconductance element gm the output of which is connected to the first output terminal 73. Further, the first output terminal 73 is connected via an output capacitance Cgs to the second output terminal 74.

FIG. 1b illustrates another commonly used symbolic illustration of the transistor 70 in a simplified way, wherein the second input terminal 72 and the second output terminal 74 which are connected to ground potential 75 are omitted. Thereby, the transistor 70 comprises a single input terminal 71 and a single output terminal 73, wherein it is evident that the input terminal 71 is connected to a gate of the transistor 70, the output terminal 73 is connected to a drain of the transistor 70.

Figure 2:
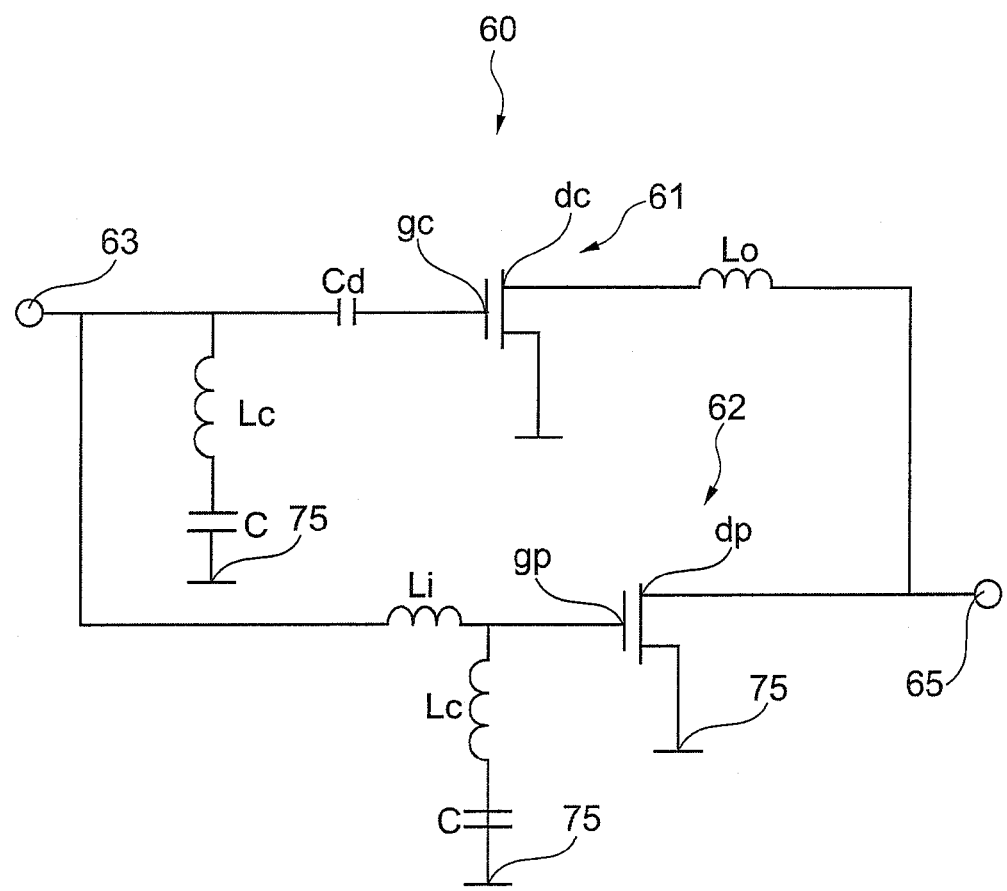
FIG. 2 schematically illustrates a circuit diagram of a conventional Doherty amplifier.

FIG. 2 schematically illustrates a circuit diagram of a conventional Doherty amplifier 60. Using the simplified illustration of a transistor according to FIG. 1b the conventional Doherty amplifier 60 comprises a main (or carrier) amplifier 61 and a peak amplifier 62. The conventional Doherty amplifier 60 comprises an input terminal 63 to which an input signal may be applied which will be amplified to an output signal supplied to an output terminal 65. The input terminal 63 is connected to a series connection of the inductance Lc and the capacitor C and is further connected to a capacitor Cd which is connected to a gate gc of the main transistor 61. The input terminal 63 is further connected to an inductance Li providing a quarter wavelength transmission line to supply the input signal phase shifted by 90° to the gate gp of the peak transistor 62. The gate gp is further connected to a series connection of an inductance Lc and a capacitor C which is connected to ground potential 75. The drain dc of the carrier transistor 61 is connected to an inductance Lo which provides a quarter wavelength transmission line and is then combined with a signal supplied to the drain dp of the peak transistor 62, wherein the combined signal is supplied to the output terminal 65.

Figure 3:
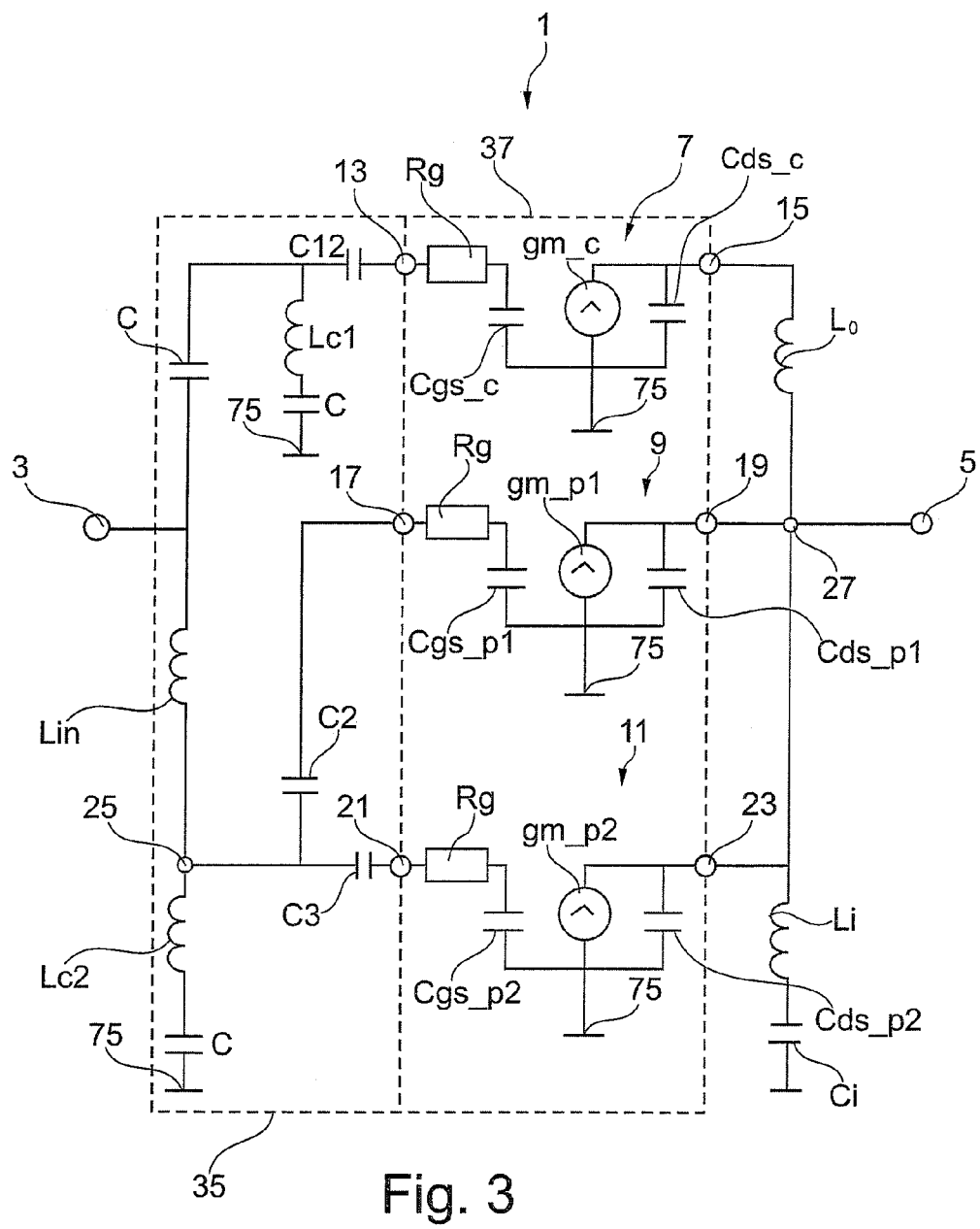
FIG. 3 schematically illustrates a circuit diagram of a combination amplifier according to an embodiment.

FIG. 3 schematically illustrates an example of a circuit implementation of a Doherty amplifier 1 according to an embodiment. The Doherty amplifier may be considered as a combination amplifier comprising several amplifiers which are connected in parallel. The Doherty amplifier 1 comprises a Doherty amplifier input terminal 3 and a Doherty amplifier output terminal 5. An input signal supplied to the Doherty amplifier input terminal 3 will be amplified by the Doherty amplifier 1 to generate an output signal at the Doherty amplifier output terminal 5. Thereby, the input signal may be for example a voltage signal and the output signal may for example be a current signal which may be described as a function of the voltage input signal. The Doherty amplifier 1 comprises a carrier amplifier 7, a first peak amplifier 9 and a second peak amplifier 11. These three amplifiers are illustrated according to the simplified illustration of a transistor according to FIG. 1a, but may comprise further electronic components. The carrier amplifier 7 comprises a carrier amplifier input terminal 13 and a carrier amplifier output terminal 15. The first peak amplifier 9 comprises a first peak amplifier input terminal 17 and a first peak amplifier output terminal 19. The second peak amplifier 11 comprises a second peak amplifier input terminal 21 and a second peak amplifier output terminal 23. The carrier amplifier 7, the first peak amplifier 9, and the second peak amplifier 11 may for example be transistors of a same type or of mutually different types. The three amplifiers may comprise for example a FET, a JFET, a MOSFET, a LDMOS and/or a GaN HEMT. The three amplifiers may comprise same or different input resistances Rg and further, the three amplifiers may comprise same or different input capacitors $Cgs\_c$, $Cgs\_p1$ and $Cgs\_p2$. Further, the three amplifiers may comprise same or different output capacitors $Cds\_c$, $Cds\_p1$, $Cds\_p2$. The resistance and the capacitor at the respective input terminal of the three amplifiers may be adapted for providing an appropriate input matching. A wideband and simple input matching of a power FET may be achieved by applying a shunt inductance Lc1 providing a parallel resonance with $Cgs\_c$ at an operational frequency of the input signal applied to the Doherty amplifier input terminal 3.

The carrier amplifier 7, the first peak amplifier 9 and the second peak amplifier 11 may have different properties in particular regarding their transconductances.

The circuitry between the Doherty amplifier input terminal 3 and the input terminals 13, 17 and 21 of the three amplifiers provide an input power distribution network also allowing adjustment of an input impedance of the Doherty amplifier 1. The Doherty amplifier input terminal 3 is connected via a capacitor C and a capacitor C1 to the carrier amplifier input terminal 13. In between the capacitor C and the capacitor C1 a series connection of an inductance Lc1 and a further capacitor C is connected. Further, the Doherty amplifier input terminal 3 is connected to one end of an inductance Lin which other end is connected to an input mid point 25. The inductance Lin provides a quarter wavelength transmission line for providing the input signal applied at the Doherty amplifier input terminal 3 phase shifted by 90° to the mid point 25. The mid point 25 is connected via a capacitor C2 to the first peak amplifier input terminal 17 and the mid point 25 is connected via the amplifier C3 to the second peak amplifier input terminal 21. Further, the mid point 25 is connected to a series connection of an inductance Lc2 and a capacitor C.

To those experienced in RF design it should be clear that instead of C, Lc1 and C, Lc2 the similar LC networks connected between ground and amplifier input terminals 13,17 and 21 can be used to tune input impedance of each device allowing additional control over input impedance, power distribution and phase shift between these three terminals. Capacitor C of the LC, if connected to the ground, can be used also for connecting DC bias to the device gates, without disturbing their RF matching.

The carrier amplifier output terminal 15 is connected to one end of an inductance Lo which other end is connected to an output mid point 27 which is directly connected to the Doherty amplifier output terminal 5. Further, the first peak amplifier output terminal 19 and the second peak amplifier output terminal 23 are connected to the mid point 27. Further, a series connection of an inductance Li and a capacitor Ci is connected to the mid point 27. The interconnection point of Ci and Li is convenient for supply DC voltage to be fed in.

Properties of the Doherty amplifier 1 may be described by a transfer characteristics, wherein an output current Iout supplied to the Doherty amplifier output terminal 5 may be described as a function of an input voltage Vin applied to the Doherty amplifier input terminal 3. In particular, the output current may be approximated by a power series of the input voltage:

$$Iout = g1 Vin + g2 Vin^2 + g3 Vin^3 + g4 Vin^4,$$

wherein the third order intermodulation level (IM3) is given by $$IM3 = 3/4 g3 Vin^3.$$

According to an embodiment the characteristics of the carrier amplifier 7, the first peak amplifier 9 and the second peak amplifier 11 are chosen such that the third order intermodulation level is minimized. In particular, the first peak amplifier 9 and the second peak amplifier 11 may have different periphery, threshold gate voltage, gate bias or driving signal. Advantageously, all these parameters may be controlled independently to improve the performance of the Doherty amplifier 1. According to an embodiment the transfer characteristics of the Doherty amplifier 1 schematically illustrated in FIG. 3 is composed from the transfer characteristics of the individual amplifiers 7, 9 and 11. Thereby, the linearity and/or efficiency of the combination amplifier 1 may be improved by appropriately choosing the transfer characteristics of the individual amplifiers 7, 9 and 11. Using at least two peak amplifiers 9 and 11 allows further flexibility for adjustment of linearity and efficiency.

According to other embodiments more than two peak amplifiers, such as three, four, five or even more may be provided allowing further improvement of the composed transfer function.

According to an embodiment a theory of linearity of a class AB amplifier is employed for an optimized design of the Doherty amplifier 1 illustrated in FIG. 3. In particular, it has been found by Mark P. van der Heijden, Henk de Graaff, Leo de Vreede, John Gajadharsing, and Joachim Burghartz in "Theory and design of an ultra-linear square-law approximated LDMOS power amplifier in class-AB operation", IEEE Transactions on Microwave Theory and Techniques, Volume 50, No. 9, September 2002, that a square-law behaviour of the drain current versus gate voltage relationship may improve linearity of a class AB amplifier. According to an embodiment this square-law behaviour is approximated in the output current-input voltage relationship of the Doherty amplifier 1.

Figure 4:
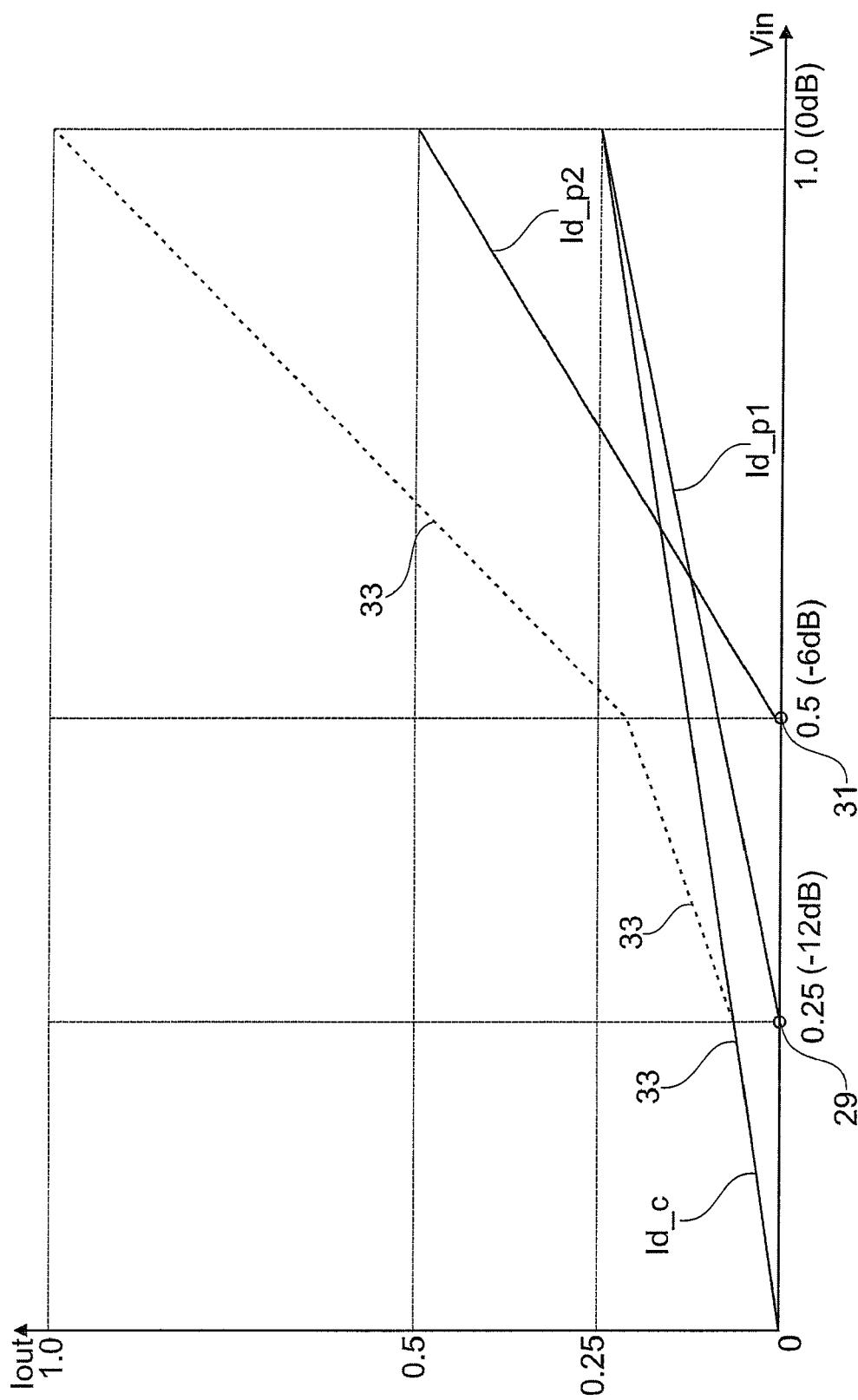
FIG. 4 shows a graph illustrating properties of a combination amplifier according to an embodiment.

FIG. 4 illustrates a graph of the output current-input voltage relationship of an exemplary design of a Doherty amplifier 1 illustrated in FIG. 3.

Along the x-axis the input voltage Vin applied to the Doherty amplifier input terminal 3 is indicated and along the y-axis the output current Tout supplied to the Doherty amplifier output terminal 5 is indicated. A curve label Id-c describes the drain current at the carrier amplifier output terminal 15 in dependence of a gate voltage supplied to the carrier amplifier input terminal 13. The curve Id-c is a straight line having a gradient associated with the transconductance gm_c of the carrier amplifier 7 which is in this case 0.25 A/V. The curve labelled Id_p1 represents the relationship between an input voltage supplied at the first peak amplifier input terminal 17 and the drain current supplied to the first peak amplifier output terminal 19. The curve Id_p1 is a straight line intersecting the x-axis at a first transition point 29 which in the illustrated example is located at 0.25 of the maximal input voltage Vin. The location of the first transition point 29 may depend on a bias voltage applied to a gate of the first peak amplifier. A curve labelled Id_p2 illustrates the drain current supplied to the second peak amplifier output terminal 23 in dependence of a gate voltage supplied to the second peak amplifier input terminal 21. As is apparent, the curve Id_p2 is a straight line intersecting the x-axis at a second transition point 31 which at the illustrated example lies at 0.5 times the maximum input voltage. It is apparent that a gradient of the curve Id_p2 is greater than a gradient of the curve Id_p1 which in turn is greater than a gradient of the curve Id_c.

A dependence of the output current Iout supplied to the Doherty amplifier output terminal 5 in dependence of an input voltage Vin applied to the Doherty amplifier input terminal 3 may be obtained by composing the curves Id_c, Id_p1 and Id_p2 in order to obtain a composed curve 33. The composed curve 33 is composed of three straight line portions, the first portion lying between 0 and the first transition point 29, the second portion lying between the first transition point 29 and the second transition point 31, and the third portion lying between the second transition point 31 and the maximal input voltage Vin. Thereby, the composed curve 33 approximates the square-law behaviour found for a class AB amplifier to improve linearity.

In particular, the gradient of the curve Id_c may represent a transconductance of the carrier amplifier 7, a gradient of the curve Id_p1 may represent a transconductance of the first peak amplifier 9, and the gradient of the curve Id_p2 may represent a transconductance of the second peak amplifier 11. In particular, according to an exemplary embodiment the transconductance of the carrier amplifier may be 0.25 A/V, the transconductance of the first peak amplifier 9 may be 0.33 A/V, and the transconductance of the second peak amplifier 11 may be 1.0 A/V. In other embodiments the transconductances of the three amplifiers as well as the transition points 29 and 31 of the first peak amplifier 9 and the second peak amplifier 11, respectively, may be altered to appropriately adjust a transfer characteristics of the Doherty amplifier 1.

Figure 5:
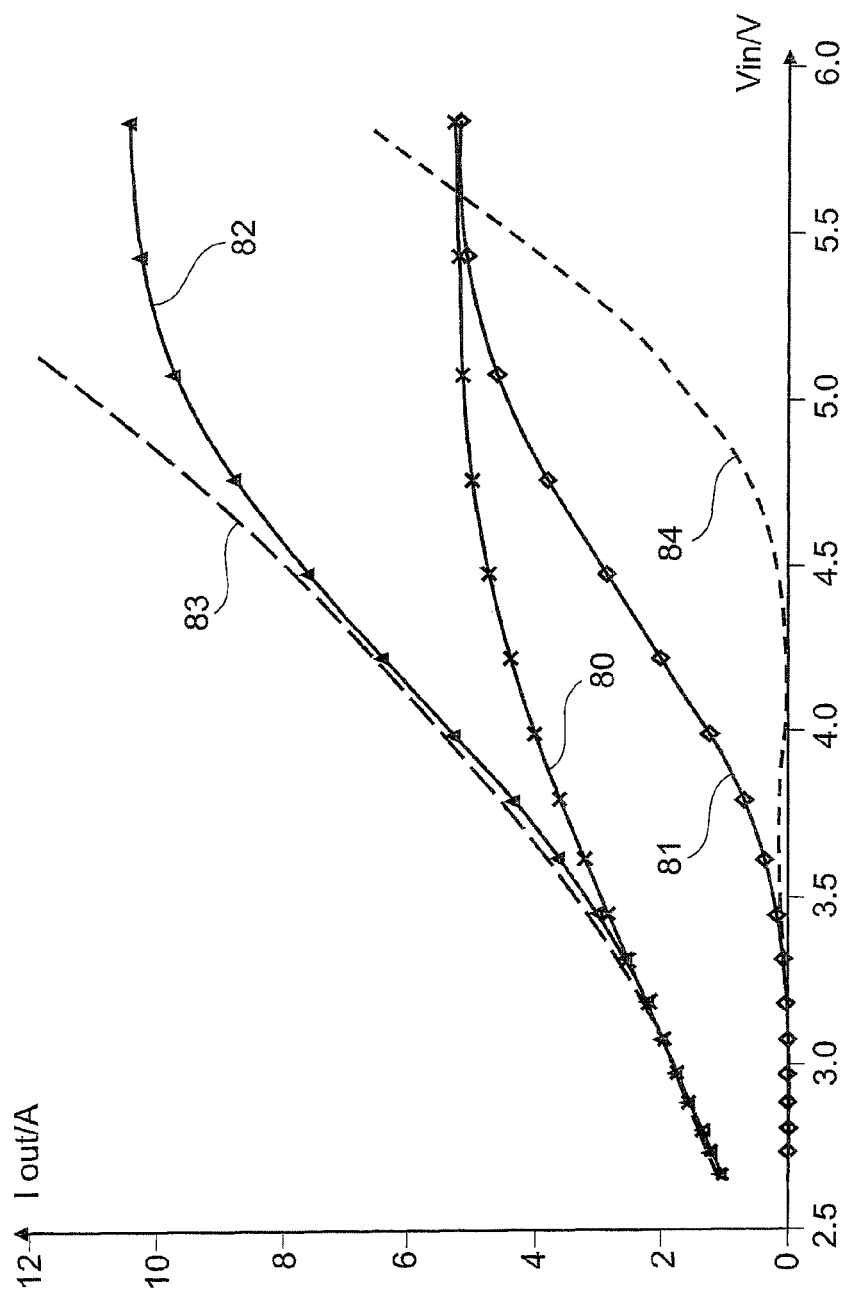
FIG. 5 shows a graph illustrating a method of designing a combination amplifier according to an embodiment.

FIG. 5 shows a graph illustrating a method of designing a combination amplifier according to an embodiment. Along the x-axis the input voltage Vin in Volt applied to the amplifier input terminals 13, 17 is indicated and along the y-axis the output current Iout in Ampere supplied to the amplifier output terminals 15, 19 of the carrier amplifier 7 (curve 80) and the first peak amplifier 9 (curve 81), respectively, is indicated. A curve 82 denotes the output current of the combination of the carrier amplifier and the first peak amplifier, i.e. the sum of the curves 80 and 81. Thus, curve 82 may represent the characteristic of a conventional Doherty amplifier having only one peak amplifier. Indicated as curve 83 is the ideal square law characteristic to be approximated for achieving high linearity. By subtracting curve 83 from curve 82 a desired transfer characteristic of the second peak amplifier 11 may be derived as depicted by curve 84. The thus derived target transfer characteristic of the second peak amplifier 11 may be achieved by appropriately choosing a type of an amplifier, a bias voltage, a gate width and the like of the second peak amplifier 11, to finally obtain a Doherty amplifier comprising two peak amplifiers and approximating the ideal square law characteristic represented by curve 83.

Figure 6:
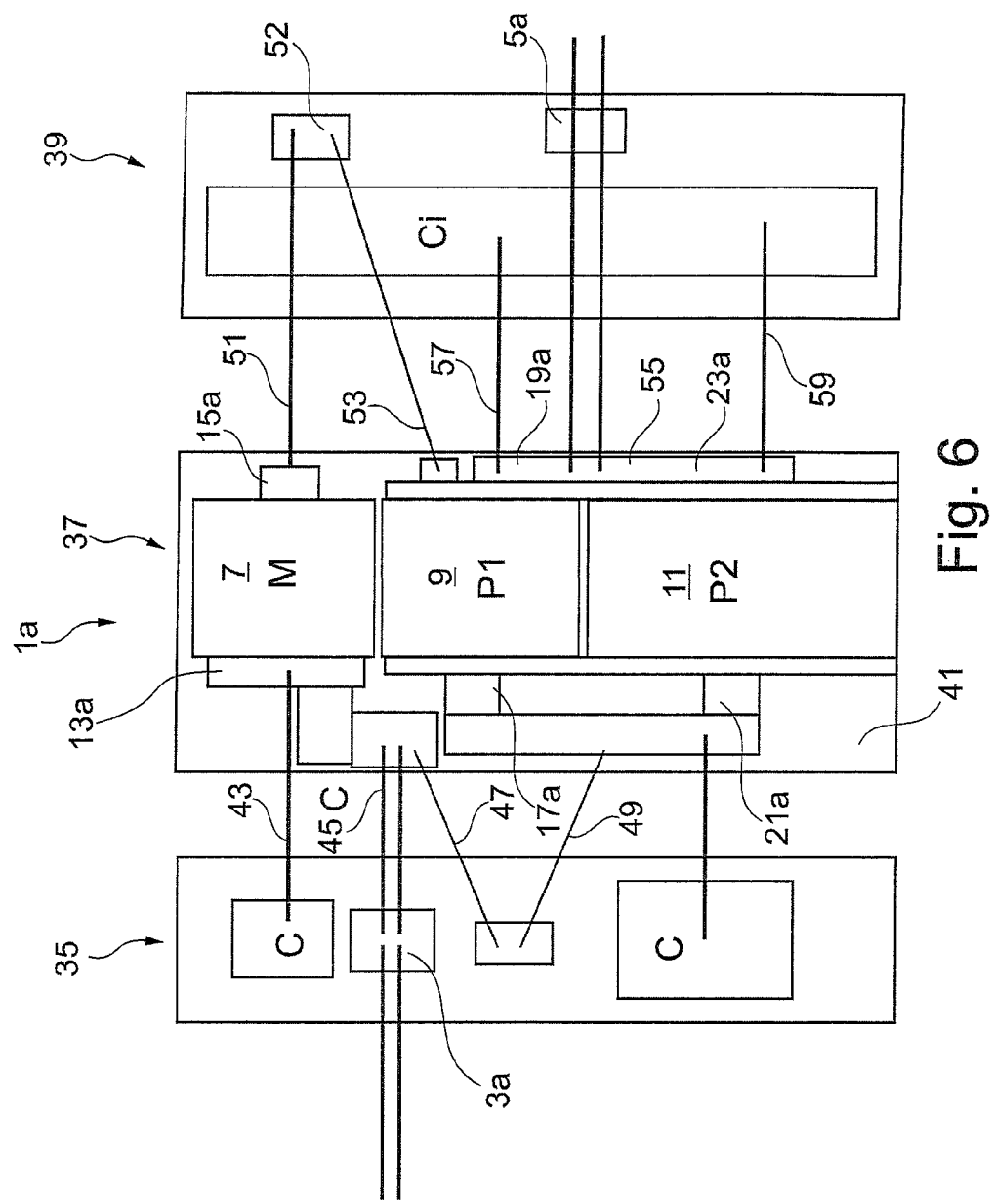
FIG. 6 schematically illustrates an integrated combination amplifier according to an embodiment.

FIG. 6 schematically illustrates a combination amplifier 1a according to an embodiment. The combination amplifier 1a comprises an input section 35, an amplifier section 37 and an output section 39. The input section 35 comprises a combination amplifier input terminal 3a to which an input signal may be supplied for amplification by the combination amplifier 1a to generate an output signal at the combination amplifier output terminal 5a comprised in the output section 39. The amplifier section 37 comprises a semiconductor substrate 41 on which the main amplifier 7, the first amplifier 9 and the second amplifier 11 are integrated. Via a capacitor C and a bond wire 45 an input signal supplied to the input terminal 3a is supplied to the carrier amplifier input terminal 13a, which is appropriately tuned by series L (wire 43) connected between terminal 13a and the ground plane through C. Further, a bond wires 47 and 49 supply the input signal from the combination amplifier input terminal 3a to the first peak amplifier input terminal 17a and the second peak amplifier input terminal 21a. Thereby, the bond wires 47, and 49 form a quarter wavelength transmission line to phase shift the input signal by 90°. The carrier amplifier 7 comprises a carrier amplifier output terminal 15a which is connected via bond wire 51 to a supporting bond pad 52 which in turn is connected via a bond wire 53 to a terminal of the first peak amplifier 9, where wire 51 and 53 together with output capacitances of carrier and peak devices serve as inductance of output impedance inverter (or so called Doherty combiner). This Doherty combiner is described as a simplest solution for illustration, but can be implemented by any other known suitable means.

As is apparent from FIG. 6 the first peak amplifier output terminal 19a and the second peak amplifier output terminal 23a are arranged at a common metal bar 55. The bond wires 51 and 53 together form an inductance of lumped element CLC analog of a transmission line for impedance inverting the output signal of the carrier amplifier 7. Further, the first peak amplifier output terminal 19a and the second peak amplifier output terminal 23a are connected by bond wires 59 and 57 to an area Ci which together form a series connection between an inductance Li and a capacitor Ci and analogously as illustrated in FIG. 3. Finally, the composed output signal is supplied to the combination amplifier output terminal 5a.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

REFERENCE SIGNS 1,1a Combination amplifier
3,3a Combination amplifier input terminal
5,5a Combination amplifier output terminal
7,7a Carrier amplifier
9,9a First peak amplifier
11,11a Second peak amplifier
13,13a Carrier amplifier input terminal
15,15a Carrier amplifier output terminal
17,17a First peak amplifier input terminal
19,19a First peak amplifier output terminal
21,21a Second peak amplifier input terminal
23,23a Second peak amplifier output terminal
25 Input mid point
27 Output mid point
29 First transition point
31 Second transition point
33 Composed curve
35 Input section
37 Amplification section
39 Output section
41 Common substrate
43,45,47,49,
51,53,57,59 Bond wires
55 Metal bar on substrate
70 Transistor
71 First input terminal of transistor
72 Second input terminal of transistor
73 First output terminal of transistor
74 Second output terminal of transistor
60 Conventional Doherty amplifier
61 Carrier amplifier
62 Peak amplifier
63 Conventional Doherty amplifier input terminal
65 Conventional Doherty amplifier output terminal
gc Gate of carrier amplifier
dc Drain of carrier amplifier
gp Gate of peak amplifier
dp Drain of peak amplifier

The invention claimed is:

1. A combination amplifier comprising:
a combination amplifier input terminal;
a combination amplifier output terminal;
a carrier amplifier having a carrier amplifier input terminal and a carrier amplifier output terminal;
a first peak amplifier having a first peak amplifier input terminal and a first peak amplifier output terminal;
a second peak amplifier having a second peak amplifier input terminal and a second peak amplifier output terminal;
an input impedance inverter; and
an output impedance inverter;
wherein one end of the input impedance inverter is connected to the carrier amplifier input terminal and is also connected to the combination amplifier input terminal, and another end of the input impedance inverter is connected to an input mid point to which the first peak amplifier input terminal and the second peak amplifier input terminal are connected;
wherein one end of the output impedance inverter is connected to the carrier amplifier output terminal, and another end of the output impedance inverter is connected to an output mid point to which the first peak amplifier output terminal and the second peak amplifier output terminal are connected and is also connected to the combination amplifier output terminal,
wherein an input signal applied at the combination amplifier input terminal is supplied to the carrier amplifier input terminal without phase shift, whereas the input signal supplied to the combination amplifier input terminal is provided to both the first peak amplifier input terminal and the second peak amplifier input terminal having a phase shift of 90°, and
wherein a first bias voltage is applied to the first peak amplifier input terminal and a second bias voltage is applied to the second peak amplifier input terminal, and the second bias input voltage is greater than the first bias input voltage;
wherein the carrier amplifier, the first peak amplifier, and the second peak amplifier are integrated on a common semiconductor substrate; and
wherein a lateral dimension of the substrate is smaller than a wavelength of a signal applied to the combination amplifier input terminal.

2. The combination amplifier according to claim 1, wherein at least one of the input impedance inverter and the output impedance inverter comprises a bond wire.

3. The combination amplifier according to claim 1, wherein the first peak amplifier output terminal and the second peak amplifier output terminal are connected to a common metal bar.

4. The combination amplifier according to claim 1, wherein each the carrier amplifier, the first peak amplifier, and the second peak amplifier comprises at least one transistor which is one of a FET, a JFET, a MOSFET, a LDMOS, a GaN HEMT, and a bipolar junction transistor.

5. The combination amplifier according to claim 4, wherein the at least one transistor of the first peak amplifier and the at least one transistor of the second peak amplifier are of a same type.

6. The combination amplifier according to claim 4, wherein a gate width of the at least one transistor of the first peak amplifier is different from a gate width of the at least one transistor of the second peak amplifier.

7. The combination amplifier according to claim 4, wherein the at least one transistor of the first peak amplifier and the at least one transistor of the second peak amplifier have different threshold voltages above which their gates conduct.

8. The combination amplifier according claim 4, wherein the at least one transistor of the first peak amplifier is has a first transconductance and the at least one transistor of the second peak amplifier has a second transconductance, and the second transconductance is greater than the first transconductance.

9. The combination amplifier according to claim 8, wherein the at least one transistor of the carrier amplifier has a carrier transconductance, and the carrier transconductance is smaller than the first transconductance.

10. The combination amplifier according to claim 9, wherein the carrier transconductance, the first transconductance, the second transconductance, the first bias voltage, and the second bias voltage are such that an output current supplied to the combination amplifier output terminal depends on a square of an input voltage applied to the combination amplifier input terminal.

11. The combination amplifier according to claim 1, wherein the first peak amplifier and the second peak amplifier input terminals are connected to the input mid point via a plurality of capacitors.

12. The combination amplifier according to claim 1, wherein at least one of the input mid point, the output mid point, and the carrier input terminal are connected to a LC compensation network.

13. A combination amplifier comprising:
a combination amplifier input terminal;
a combination amplifier output terminal;
a carrier amplifier having a carrier amplifier input terminal and a carrier amplifier output terminal;
a first peak amplifier having a first peak amplifier input terminal and a first peak amplifier output terminal;
a second peak amplifier having a second peak amplifier input terminal and a second peak amplifier output terminal;
an input impedance inverter; and
an output impedance inverter;
wherein one end of the input impedance inverter is connected to the carrier amplifier input terminal and is also connected to the combination amplifier input terminal, and another end of the input impedance inverter is connected to an input mid point to which the first peak amplifier input terminal and the second peak amplifier input terminal are connected;
wherein one end of the output impedance inverter is connected to the carrier amplifier output terminal, and another end of the output impedance inverter is connected to an output mid point to which the first peak amplifier output terminal and the second peak amplifier output terminal are connected and is also connected to the combination amplifier output terminal,
wherein an input signal applied at the combination amplifier input terminal is supplied to the carrier amplifier input terminal without phase shift, whereas the input signal supplied to the combination amplifier input terminal is provided to both the first peak amplifier input terminal and the second peak amplifier input terminal having a phase shift of 90°, and
wherein a first bias voltage is applied to the first peak amplifier input terminal and a second bias voltage is applied to the second peak amplifier input terminal, and the second bias input voltage is greater than the first bias input voltage;
wherein each the carrier amplifier, the first peak amplifier, and the second peak amplifier comprises at least one transistor which is one of a FET, a JFET, a MOSFET, a LDMOS, a GaN HEMT, and a bipolar junction transistor; and
wherein a gate width of the at least one transistor of the first peak amplifier is different from a gate width of the at least one transistor of the second peak amplifier.

14. A combination amplifier comprising:
a combination amplifier input terminal;
a combination amplifier output terminal;
a carrier amplifier having a carrier amplifier input terminal and a carrier amplifier output terminal;
a first peak amplifier having a first peak amplifier input terminal and a first peak amplifier output terminal;
a second peak amplifier having a second peak amplifier input terminal and a second peak amplifier output terminal;
an input impedance inverter; and
an output impedance inverter;
wherein one end of the input impedance inverter is connected to the carrier amplifier input terminal and is also connected to the combination amplifier input terminal, and another end of the input impedance inverter is connected to an input mid point to which the first peak amplifier input terminal and the second peak amplifier input terminal are connected;
wherein one end of the output impedance inverter is connected to the carrier amplifier output terminal, and another end of the output impedance inverter is connected to an output mid point to which the first peak amplifier output terminal and the second peak amplifier output terminal are connected and is also connected to the combination amplifier output terminal,
wherein an input signal applied at the combination amplifier input terminal is supplied to the carrier amplifier input terminal without phase shift, whereas the input signal supplied to the combination amplifier input terminal is provided to both the first peak amplifier input terminal and the second peak amplifier input terminal having a phase shift of 90°, and
wherein a first bias voltage is applied to the first peak amplifier input terminal and a second bias voltage is applied to the second peak amplifier input terminal, and the second bias input voltage is greater than the first bias input voltage;
wherein each the carrier amplifier, the first peak amplifier, and the second peak amplifier comprises at least one transistor which is one of a FET, a JFET, a MOSFET, a LDMOS, a GaN HEMT, and a bipolar junction transistor; and
wherein the at least one transistor of the first peak amplifier is has a first transconductance and the at least one transistor of the second peak amplifier has a second transconductance, and the second transconductance is greater than the first transconductance.

15. The combination amplifier according to claim 14, wherein the at least one transistor of the carrier amplifier has a carrier transconductance, and the carrier transconductance is smaller than the first transconductance.

16. The combination amplifier according to claim 15, wherein the carrier transconductance, the first transconductance, the second transconductance, the first bias voltage, and the second bias voltage are such that an output current supplied to the combination amplifier output terminal depends on a square of an input voltage applied to the combination amplifier input terminal.

* * * * *